United States Patent [19]
Tao et al.

[11] Patent Number: 5,837,599
[45] Date of Patent: Nov. 17, 1998

[54] WAFER SURFACE MODIFICATION FOR IMPROVED ELECTROSTATIC CHUCKING EFFICIENCY

[75] Inventors: Hun-Jan Tao; Chia-Shiung Tsai, both of Hsin-chu, Taiwan

[73] Assignee: Taiwan Semiconductor Manufacturing Co. Ltd., Hsin-Chu, Taiwan

[21] Appl. No.: 695,006

[22] Filed: Aug. 9, 1996

[51] Int. Cl.[6] .................................................. H01L 21/20
[52] U.S. Cl. ........................ 438/584; 438/761; 438/763; 438/928
[58] Field of Search ..................... 438/584, 761, 438/763, 928; 427/337, 344, 419.1–419.3

Primary Examiner—John Niebling
Assistant Examiner—David A. Zarneke
Attorney, Agent, or Firm—Tung & Associates

[57] ABSTRACT

A method of improving electrostatic chucking efficiency between a silicon wafer which has an oxide layer formed on a back side and a susceptor positioned in a wafer processing chamber wherein the back side is opposite to the side of the wafer to be processed for integrated circuit devices including the steps of first forming an electrically conducting layer on top of the oxide layer by transforming to a more hydrophilic oxide structure and then positioning the wafer on the susceptor with the electrically conducting layer contacting the susceptor.

15 Claims, 2 Drawing Sheets

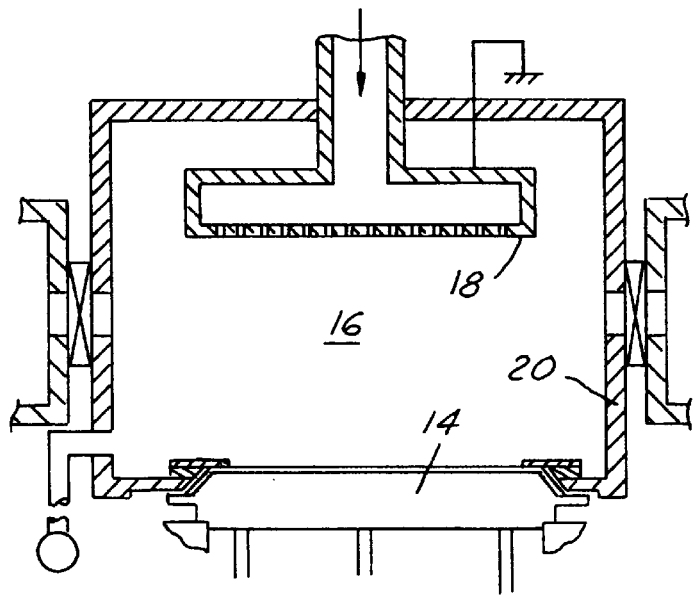
FIG. 1 (PRIOR ART)
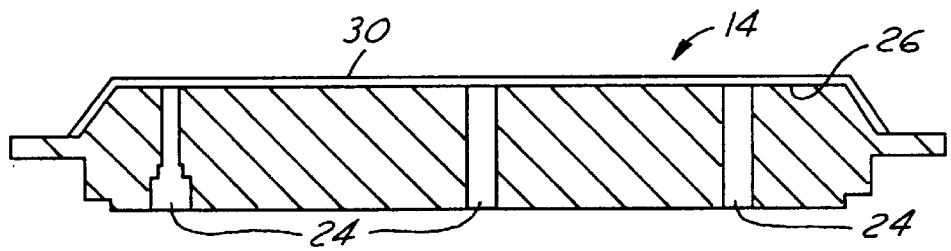
FIG. 1A (PRIOR ART)
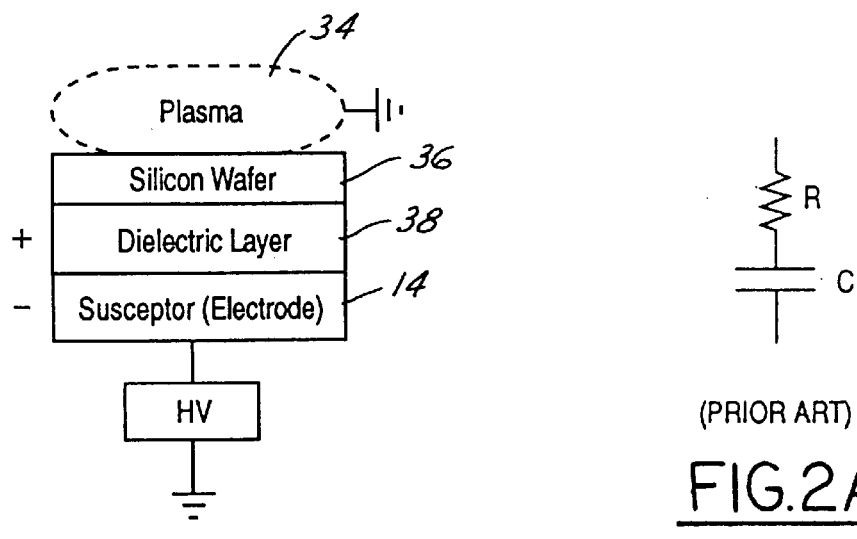
FIG. 2 (PRIOR ART)
FIG. 2A (PRIOR ART)

WAFER SURFACE MODIFICATION FOR IMPROVED ELECTROSTATIC CHUCKING EFFICIENCY

FIELD OF THE INVENTION

The present invention generally relates to electrostatic chucking in a wafer processing chamber and more particularly, relates to a method of improving electrostatic chucking efficiency for silicon wafers that have thick oxide backing layers.

BACKGROUND OF THE INVENTION

Electrostatic chucking (or E-Chuck) is a technique used to secure a wafer onto a susceptor in a wafer processing chamber. In more recently developed wafer processing technology, the electrostatic wafer holding technique is frequently employed in which a chuck electrostatically attracts and holds the wafer. It is a highly desirable technique used in the vacuum handling and processing of silicon wafers. In contrast to a conventional method of holding wafers by either gravity or mechanical clamping means where only slow motion of the susceptor is allowed during wafer handling, an electrostatic wafer holding device can hold wafers with a force equivalent to several tens of torr pressure. Since there are no moving parts acting on the wafer, there are no particle generation or contamination problems in the processing chamber.

Electrostatic chucks have been used to overcome the non-uniform clamping associated with mechanical clamping devices. The electrostatic chuck utilizes the attractive coulomb force between oppositely charged surfaces to clamp together an article and a chuck. It is generally recognized that in an electrostatic chuck, the force between the wafer and the chuck is uniform for a flat wafer and a flat chuck. This is in contrast to a mechanical clamping system where the clamping is effected around the peripheral of a wafer. Special provisions must be made to compensate for the bowing at the center of the wafer caused by the pressure of cooling gas which is pumped in between the wafer and the pedestal that is supporting and cooling the wafer. For instance, in order to compensate for the bowing of the wafer, one solution is to make the pedestal in a domed or bowed shape. This is eliminated in an electrostatic chuck where the wafer is held on a substantially planar chuck surface with an even electrostatic force distributed according to the electrode layout. The electrostatic force is generally sufficient to prevent bowing of the wafer and to promote uniform heat transfer over the entire wafer surface.

In the normal operation of an electrostatic chuck, one or more electrodes formed in the chuck body induce an electrostatic charge on the surface of a dielectric material that is coated over the chuck surface facing the wafer, i.e., between the bottom surface of the wafer and the top surface of the chuck. A typical dielectric material that can be used for such purpose is, for instance, a polyimide material.

FIG. 1 is a cross-sectional view of a typical vacuum process chamber for etching semiconductor wafers. A vacuum process chamber 10 is equipped with an electrostatic chuck 14. A plasma reaction region 16 is formed by a reaction gas inlet 18, a side wall 20, and the electrostatic chuck 14. The reaction gas inlet 18 also serves as the upper RF electrode.

An enlarged, cross-sectional view of the electrostatic chuck 14 is shown in FIG. 1A. The electrostatic chuck 14 has a multiplicity of cooling gas channels 24 provided at its top surface 26. The cooling gas channels 24 are used to circulate a heat transfer gas such as helium at a suitable pressure to the bottom side of the wafer (not shown) for transferring heat from the wafer to the water-cooled chuck 14 during an etching process. A dielectric layer 30 is coated on the top surface 26 of the electrostatic chuck 14.

In a typical semiconductor wafer process, such as in a $SiO_2$ etching process, the wafer may be RF biased for enhanced process performance. This is shown in FIG. 2. In a typical plasma etching process, a uniform coupling of RF biased energy through the wafer being processed to the plasma is desirable. The wafer being processed is typically held against the electrostatic chuck and RF biased energy is applied to the chuck. The formation of a constant plasma sheath 34 across the surface of the silicon wafer 36 that is being processed is therefore highly desirable. A circuit equivalent illustrating the electrostatic effect of FIG. 2 is shown in FIG. 2A where R is the resistance provided by the dielectric layer 38 (or the thick oxide backing layer on the wafer).

In the operation of an electrostatic chuck, the electrostatic force between the wafer and the chuck is proportional to the square of the voltage between them, to the dielectric constant of the dielectric layer, and inversely proportional to the square of the distance between the wafer and the chuck.

$$\text{Electrostatic Chucking Force} \approx k(V/d)^2$$

wherein k is the dielectric constant of the dielectric layer, V is the voltage drop across the dielectric film, and d is the thickness of the dielectric layer. The charging/discharging time constant is RC. As shown in FIG. 2A, when R is very large for a thick oxide backing layer (i.e., d is very large), the electrostatic chucking force can be greatly reduced causing the electrostatic chucking of the wafer to fail.

Since the principal of electrostatic chucking is that there must exist an attractive force between two parallel plates, i.e. between the silicon wafer 36 and the susceptor 14 of FIG. 2, that have opposite electrical charges, the chucking efficiency is not only determined by the bias voltage, the dielectric constant of the system, the effective distance between the two parallel plates, but also is determined by the wafer grounding efficiency. To utilize electrostatic chucking efficiently in a wafer processing chamber, the surface of the wafer should be electrically conductive so that it can be properly grounded. When a wafer has a thick insulating backing layer such as the oxide layer shown in FIG. 3, it is difficult or impossible to perform electrostatic chucking under normal processing conditions. For a poorly grounded wafer, the effective bias voltage across the wafer-susceptor interface is very low and as a consequence, electrostatic chucking cannot be carried out.

It is therefore an object of the present invention to provide a method capable of holding a wafer on an electrostatic chuck efficiently that does not have the drawbacks and shortcomings of the prior art methods.

It is another object of the present invention to provide a method of holding a silicon wafer that has a thick insulating backing layer on an electrostatic chuck efficiently in a vacuum process chamber.

It is a further object of the present invention to provide a method of holding a silicon wafer that has a thick insulating backing layer efficiently on an electrostatic chuck by modifying the surface of the insulating layer chemically.

It is still another object of the present invention to provide a method of holding a silicon wafer that has a thick oxide backing layer efficiently on an electrostatic chuck by forming an electrically conducting layer on the surface of the oxide layer.

It is yet another object of the present invention to provide a method of holding a silicon wafer that has a thick oxide backing layer efficiently on an electrostatic chuck by changing the surface chemistry of the oxide layer to a more hydrophilic structure.

It is another further object of the present invention to provide a method of holding a silicon wafer that has a thick oxide backing layer efficiently on an electrostatic chuck by contacting the oxide layer with an aqueous solution of a chemical selected from the group consisting of ammonia aqueous solution, alkali hydroxides, BOE and ethoxysilane having amine, hydroxy or carboxylic acid end groups.

It is still another further object of the present invention to provide a silicon wafer that has an electrically conducting layer formed on the surface of an oxide insulating layer on the backside of the wafer.

SUMMARY OF THE INVENTION

In accordance with the present invention, a method of improving the electrostatic chucking efficiency of a silicon wafer that has a thick oxide backing layer is provided.

In the preferred embodiment, the silicon wafer that has the thick oxide backing layer is first contacted with an aqueous solution of either an alkali hydroxide or ammonia. Ionic silicate groups are formed in the surface layer of the oxide such that the oxide changes to a more hydrophilic structure. The wafer is then washed with deionized water so that water is absorbed in the surface layer of the oxide to gain electrical conductivity. The silicate concentration can be controlled such that a predetermined electrical conductivity can be obtained on the oxide surface. In the preferred embodiment, both proton transfer and ion transfer contribute to the electrical conductivity which render the method more effective.

In an alternate embodiment, silicon wafers that have thick oxide backing layers are exposed to an aqueous solution of an ethoxysilane type coupling agent that has amine, hydroxy or carboxylic acid end groups or to a BOE bath, with or without $H_2O_2$. Proton transfer contributes to the electrical conductivity on the surface of the oxide layer when hydrogen bonded polar groups are first formed in the surface to transform the structure to a more hydrophilic structure and then the wafers are washed in deionized water to absorb water. The electrically conducting layer on the surface of the oxide is therefore made possible by the formation of the hydrogen bonded polar groups and the absorption of water molecules in the oxide.

The present invention also provides a silicon wafer that has a thick oxide backing layer that is modified to become an electrically conductive surface. The wafer can be efficiently held by an electrostatic chuck in a wafer processing chamber.

BRIEF DESCRIPTION OF THE DRAWINGS

Other objects, features and advantages of the present invention will become apparent upon consideration of the specification and the appended drawings, in which:

FIG. 1 is a cross-sectional view of a wafer processing chamber equipped with a plasma source and an electrostatic chuck.

FIG. 1A is an enlarged cross-sectional view of the electrostatic chuck shown in FIG. 1.

FIG. 2 is an illustration showing a plasma sheath formed on a silicon wafer which has a thick oxide backing layer and is positioned on a susceptor.

FIG. 2A is a circuit equivalent of the arrangement shown in FIG. 2.

DETAILED DESCRIPTION OF THE PREFERRED AND THE ALTERNATE EMBODIMENTS

The present invention provides a method of improving electrostatic chucking efficiency between a silicon wafer and a susceptor in a wafer processing chamber where the wafer has a thick oxide backing layer. The method is carried out by forming an electrically conducting layer on the surface of the oxide by contacting the oxide with an aqueous solution of a surface modifying chemical. After dipping in the aqueous solution, the wafers are rinsed with deionized water and then dried. The surface layer of the oxide is changed to a more hydrophilic structure such that water molecules are absorbed to make the surface electrically conductive.

In one embodiment, the silicon wafer is first contacted by an aqueous solution of an alkali hydroxide, with or without $H_2O_2$ and then rinsed by deionized water. Ionic silicate groups are introduced in the surface layer of the oxide by a chemical reaction. The process can be conducted by dipping a wafer in the aqueous solution for a time period between about 1 and about 20 min., while a more preferred dipping time is between about 3 and about 10 min. The aqueous solution used normally has a concentration range between about 1% and about 50% for alkali hydroxides such as NaOH and KOH. The $KOH/H_2O$ solution can be heated up to about 80° C. or can be used at room temperature. The $KOH/H_2O$ solution can also be added an amount of IPA for faster drying, for example, at 250 g KOH/200 g IPA/800 g $H_2O$. After the wafers have been dipped in the aqueous solution for the specific time period, they are removed and washed by deionized water to rinse off the solution. The wafers are then dried and ready to be processed on a plasma susceptor in a wafer processing chamber.

Figure 3:
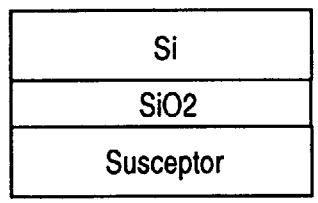
FIG. 3 is an illustration showing a silicon wafer which has a thick oxide backing layer and is positioned on a susceptor.
Figure 4:
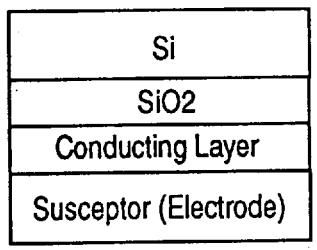
FIG. 4 is an illustration showing a present invention silicon wafer after the surface modification process wherein an electrically conducting layer is formed on the oxide layer.

An illustration of the present invention silicon wafer that has a conducting layer formed on a thick oxide backing layer positioned on a susceptor is shown in FIG. 4. It is believed that the electrical conducting layer is achieved by transforming the surface layer of the oxide to a more hydrophilic structure. This is accomplished by first introducing ionic silicate groups into the oxide and then followed by absorbing water in the surface layer. The electrical conductivity is achieved by both ionic transfer and proton transfer. The preferred embodiment is the more effective approach since the silicate concentration can be controlled to achieve the desired level of electrical conductivity. For instance, on a silicon wafer that has an oxide layer of approximately 2000 Å thick, an electrically conductive layer of approximately between about 5 Å and about 500 Å thick can be obtained after the oxide is contacted by an aqueous solution of an 5% $KOH/H_2O$ at 80° C. for 2 minutes. An improved electrical conductivity can be achieved which greatly improves the electrostatic chucking efficiency when the wafer is placed on a susceptor in a wafer processing chamber.

The advantage of the alkali hydroxides method is its high efficiency in introducing ionic groups on the oxide surface. However, this method may not be suitable for wafers that has oxide on the front side which should not be attacked. When there is a concern for alkali contamination in the process, standard RCA cleaning method can be used.

Figure 4A:
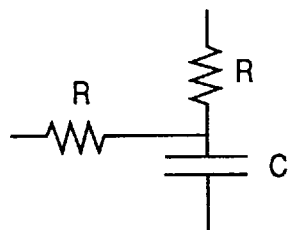
FIG. 4A is a circuit equivalent of the present invention arrangement shown in FIG. 4.

A circuit equivalent to the preferred embodiment of FIG. 4 is illustrated in FIG. 4A. It is seen that $R_1$, in series with a capacitor C, indicates the resistance contributed by the oxide backing layer on the silicon wafer. $R_2$, which has a smaller value, indicates the resistance contributed by the electrically conducting layer formed by the surface modification process. The effective R as well as RC drop due to the incorporation of the smaller $R_2$ component contributed by the conducting layer.

In another embodiment, the oxide backing layer on the silicon wafer can be modified by the introduction of polar groups in the surface of the oxide. It is known that native silanol groups can be generated when oxide is exposed to air or water. However, their concentration is not high enough and further, it is not possible to increase their concentration by existing methods. In the alternate embodiments, wafers are dipped into a dilute aqueous solution of $NH_4OH$, BOE or an ethoxysilane type coupling agent which has amine, hydroxy or carboxylic acid end groups. A suitable concentration range of the aqueous solution of the ethoxysilane coupling agent is between about 0.1% and about 10%. The wafers are dipped in the aqueous solution for a time period between about 1 and about 20 min., and more preferably, between about 2 and about 10 min, for example: 5 min in a $NH_4OH$ dip and then DI water rinse. After the wafers have been dipped in the aqueous solution for the suitable time period, they are removed, rinsed by deionized water and dried. An electrically conductive layer is formed on the surface of the oxide which improves the electrostatic chucking efficiency when the wafer is placed on a susceptor. The polar content in the oxide layer is not as easily controlled as the silicate groups introduced in the other embodiment. It is believed that only proton transfer in the oxide layer modified by the polar groups is contributing to the electrical conductivity. However, this is a preferred method if there is a concern of alkali contamination in the process, or a concern of unwanted front side oxide etch.

It is believed that ammonia can form a hydrogen-bonded network on the native oxide surface (with the native silanol groups on native oxide). The network can absorb water to form highly hydrophilic surface. Its hydrophilic strength may not be as high as that achieved by the alkali hydroxide method, but it does not introduce alkali ion contaminants. Furthermore, it does not damage the oxide on the front surface of the wafer if such is a concern. The improved ESC efficiency is good even for a 2000 Å backed oxide. Ammonia bath can be used alone, or can be used following a CAROS or BOE bath. Ammonia bath is normally a standard bath in a semiconductor fabrication plant.

In a BOE bath method, the principle is to remove the contaminants such as hydrophobic hydrocarbon contaminants, particles or other contaminats from the back oxide and then forming fresh oxide. A clean silanol layer can form on the clean oxide surface which may absorb water. The advantage of the process is that BOE is an standard bath in the fabrication plant. Furthermore, there is no ion contamination concern. The disadvantages of the BOE bath method are the smaller improvement in ESC efficiency and, the possible etching of the front side oxide if existed.

The advantage for this method is its high efficiency to introduce ionic groups on the oxide. However, its drawbacks are that the method may introduce alkali ion contaminants which can then be removed by the RCA method. The method can also etch the front side oxide on a wafer which may be a concern.

The coupling agent method has several advantages, for instance, the method does not etch the front side oxide, the method has greater improved ESC efficiency, and the method does not introduce ion contaminants. However, it may have the disadvantages that the bath is not a standard bath in a fabrication plant. Even though these types of coupling agents are readily available in other industries such as the plastics processing industry.

It should be noted that the present invention is concerned with a method of modifying the surface of a thick oxide layer formed on the backside of a silicon wafer. The chemical modification achieved in the oxide layer is believed to be a transformation to a more hydrophilic oxide. As illustrated in the preferred and the alternate embodiments, aqueous solutions of various chemicals such as $NH_4OH$, alkali hydroxides, BOE and ethoxysilane coupling agent that has amine, hydroxy or carboxylic acid end groups can be used to suitably convert the oxide surface by introducing ionic silicate or other polar groups. Other suitable chemical agents can also be used in aqueous or non-aqueous solutions to accomplish the transformation in the oxide layer as long as ionic silicon-based groups or other polar groups can be introduced into the oxide such that water molecules can be absorbed into the surface layer of the oxide to render it electrically conductive. The present invention method may also be applied to insulating layers on wafers that is formed by a material that is not oxide. For instance, an insulating layer of silicon oxynitride may be modified similarly to make its surface electrically conductive.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

1. A method of improving electrostatic chucking efficiency between a silicon wafer and a susceptor situated in a wafer processing chamber comprising the steps of:

providing a silicon wafer having an insulating layer formed on the side to be contacted by the susceptor, forming an electrically conducting layer on top of said insulating layer, and positioning said wafer on and with said electrically conducting layer juxtaposed to said susceptor.

2. A method according to claim 1, wherein said insulating layer is an oxide layer or an oxynitride layer.

3. A method according to claim 2, wherein said electrically conducting layer is formed by transforming to a more hydrophilic oxide structure.

4. A method according to claim 1, wherein said electrically conducting layer is formed by contacting an oxide layer with an aqueous solution of a chemical selected from the group consisting of a)$NH_4OH$, b)alkali hydroxides, c)BOE and d)ethoxysilane having amine, hydroxy or carboxylic acid end groups.

5. A method according to claim 4 further comprising the step of washing said wafer with deionized water after said contacting step.

6. A method according to claim 1, wherein said oxide layer is sufficiently thick to render the silicon wafer substantially non-conductive electrically.

7. A method according to claim 1, wherein said oxide layer having a thickness of at least about 5 Angstroms.

8. A method according to claim 1, wherein said oxide layer having a thickness at least about 100 Angstroms.

9. A method of improving electrostatic chucking efficiency between a silicon wafer having an oxide layer formed on a back side and a susceptor positioned in a wafer processing chamber wherein said back side being opposite to the side of the wafer to be processed for integrated circuit devices comprising the steps of:

forming an electrically conducting layer on said oxide layer of said wafer by transforming to a more hydrophilic oxide structure, and positioning said wafer on said susceptor with said electrically conducting layer juxtaposed to said susceptor.

10. A method according to claim 9, wherein said insulating layer is an oxide layer or an oxynitride layer.

11. A method according to claim 9, wherein said electrically conducting layer is formed by contacting said oxide layer with the aqueous solution of a chemical selected from the group consisting of a)$NH_4OH$, b)alkali hydroxides, c)BOE and d)ethoxysilanes having amine, hydroxy or carboxylic acid end groups.

12. A method according to claim 11 further comprising the step of washing said wafer with deionized wafer after contacting with aqueous solution of said chemical.

13. A method according to claim 9, wherein said oxide layer having a thickness sufficient to make the back side of said wafer substantially non-conductive electrically.

14. A method according to claim 9, wherein said oxide layer having a thickness of at least about 5 Angstroms.

15. A method according to claim 9, wherein said oxide layer having a thickness of at least about 100 Å.

* * * * *